(12) United States Patent
Frohberg et al.

(10) Patent No.: US 7,279,415 B2
(45) Date of Patent: Oct. 9, 2007

(54) METHOD FOR FORMING A METALLIZATION LAYER STACK TO REDUCE THE ROUGHNESS OF METAL LINES

(75) Inventors: Kai Frohberg, Meissen (DE); Matthias Schaller, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 158 days.

(21) Appl. No.: 11/043,200

(22) Filed: Jan. 26, 2005

(65) Prior Publication Data

US 2005/0245041 A1 Nov. 3, 2005

(30) Foreign Application Priority Data

Apr. 29, 2004 (DE) .................... 10 2004 021 085

(51) Int. Cl.
*H01L 21/4763* (2006.01)
(52) U.S. Cl. .................... 438/637; 438/672; 438/700
(58) Field of Classification Search ........ 438/637–638, 438/672–673, 700
See application file for complete search history.

(56) References Cited

U.S. PATENT DOCUMENTS

| 6,168,726 | B1 | 1/2001 | Li et al. ................... 216/79 |
| 6,350,700 | B1 | 2/2002 | Schinella et al. ........... 438/723 |
| 6,475,925 | B1* | 11/2002 | Braeckelmann et al. .... 438/763 |
| 6,514,849 | B1 | 2/2003 | Hui et al. .................. 438/618 |
| 6,969,685 | B1* | 11/2005 | Li et al. .................... 438/710 |
| 2003/0235993 | A1 | 12/2003 | Leung et al. ............... 438/710 |
| 2004/0161930 | A1* | 8/2004 | Ma et al. ................... 438/689 |
| 2005/0130411 | A1* | 6/2005 | Bao et al. .................. 438/637 |

* cited by examiner

*Primary Examiner*—Dung Anh Le
(74) *Attorney, Agent, or Firm*—Williams, Morgan & Amerson, P.C.

(57) ABSTRACT

A method for making a simplified dielectric layer stack for the first metallization layer is provided in combination with an improved anisotropic etch process, wherein the etch attack at the trench perimeter is reduced for a patterning process on the basis of a 193 nm lithography. In the simplified layer stack, a bottom etch stop layer formed beneath a low-k dielectric layer may be omitted, thereby reducing production costs while enhancing product performance by lowering leakage currents in the first metallization layer.

16 Claims, 5 Drawing Sheets

METHOD FOR FORMING A METALLIZATION LAYER STACK TO REDUCE THE ROUGHNESS OF METAL LINES

BACKGROUND OF THE INVENTION

1. Field of the Invention

The present invention generally relates to the fabrication of integrated circuits, and, more particularly, to the formation of metal lines formed in a low-k dielectric material, wherein the dimensions of the metal line trenches may be defined by a 193-nm lithography technique.

2. Description of the Related Art

The fabrication of an integrated circuit is a highly complex process requiring up to 500 or even more single process steps for sophisticated semiconductor devices, such as microprocessors, storage devices, ASICs (application specific integrated circuits) and the like, wherein one of the most critical process steps is the lithographical imaging of a specified circuit pattern provided on a mask or reticle into a resist layer formed on a substrate and the subsequent patterning of the resist layer. The patterned resist layer is then used as a mask for the subsequent patterning of underlying material layers by, for instance, anisotropic etch procedures, ion implantation and the like.

In the field of manufacturing integrated circuits, there is an ongoing drive to steadily decrease the feature sizes of circuit elements so that reproducible and robust processes have to be continuously established and/or adapted to more sophisticated process constraints. Presently, advanced integrated circuits that are available as mass products include circuit elements having dimensions which are well below the optical resolution of the lithography apparatus used for imaging a pattern from the reticle to the specified material layer formed on the substrate. The formation of circuit elements with dimensions less than the wavelength of the exposure radiation used for the lithography is based on a highly non-linear behavior of the resist materials used and on other process techniques, such as trim etch processes and the like. In spite of non-optical process techniques for reducing dimensions of resist features or obtaining minimum feature sizes, it is, however, nevertheless necessary to also reduce the exposure wavelength corresponding to the desired minimum critical dimensions to maintain the required accuracy in these subsequent processes. Minimum dimensions of circuit elements in sophisticated semiconductor devices are presently less than 100 nm, wherein the exposure wavelength is currently being transferred from 248 nm to 193 nm, thereby rendering a plurality of processes that are well established at an exposure wavelength of 248 nm as non-compatible with design and process requirements, for instance in view of reliability and production yield.

As noted above, the total resolution of reliably transferring circuit patterns from a lithography mask to a substrate is determined, on the one hand, by the intrinsic optical resolution of the photolithography apparatus, the characteristics of materials involved in the photolithography patterning process, such as the photoresist and any anti-reflective coatings (ARC) that are provided to minimize deleterious scattering and standing wave effects in the photoresist, and by deposition and etch procedures involved in forming the resist and ARC layers and etching these layers after exposure. In particular, the highly non-linear behavior of the photoresist in combination with sophisticated ARC layers and lithography mask techniques allows the formation of resist patterns having dimensions considerably below the intrinsic optical resolution of the photolithography apparatus. Since the plurality of process steps involved in finally obtaining a circuit element of specified dimensions mutually influence each other, the change of one process or material may typically require great effort in establishing a new appropriate process sequence that conforms with the new design and process requirements.

The development of integrated circuits of increased functionality and enhanced performance not only necessitates the reduction of critical feature sizes but also the introduction of new materials. One important aspect in enhancing the performance of integrated circuits is the reduction of parasitic capacitances to reduce a signal propagation delay caused by the intrinsic line resistance and the parasitic capacitance between neighboring metal lines. Consequently, in modern integrated circuits, aluminum-based metal lines are increasingly being replaced by copper-based metal lines, wherein the copper-based metal lines are typically embedded in a dielectric material having a reduced relative permittivity in the range of, for example, less than approximately 3.1, which are also referred to herein as low-k dielectric materials. The metal lines, which provide the electrical connection between the circuit elements in accordance with the specified circuit design, typically are also reduced in dimension when the corresponding feature sizes of the circuit elements are scaled down. The metal lines are typically arranged in several levels, also referred to as metallization layers, which are stacked upon each other, wherein the electrical connection between individual metallization layers is obtained by so-called vias. Due to the reduced dimensions of the metal lines and vias, moderately high current densities are typically encountered during the operation of modern integrated circuits, which require precise control of the metal lines and vias in order to not unduly deteriorate device reliability caused by line failure, increased leakage currents, and the like.

With reference to FIGS. 1a-1d, a conventional process sequence will now be described in more detail, in which the problems are explained occurring on the transition from a well established manufacturing sequence with a 248-nm-based process to a 193-nm-based process for metal lines in the first metallization layer.

In FIG. 1a, a semiconductor device 100 comprises a substrate 101, on which is formed a circuit element 102. A first dielectric layer 103 is formed above the substrate 101 and encloses the circuit element 102. In the first dielectric layer 103, a contact element 104 is formed of an electrically conductive material comprising, for instance, tungsten, tungsten silicide, and the like, wherein the contact element 104 extends through the first dielectric layer 103 to provide electrical contact to the circuit element 102 or a portion thereof. Hence, the first dielectric layer 103, which is comprised of silicon dioxide and/or silicon nitride, electrically insulates the contact element 104 and the circuit element 102 from any neighboring contact elements and circuit elements (not shown). Located above the first dielectric layer 103 is a dielectric etch stop layer 105, which is comprised of a dielectric material having a low permittivity as is required to reduce the parasitic capacitance of neighboring electrical connections still to be formed. For instance, frequently the etch stop layer 105, which is commonly referred to as a BLOK (buried low-k) layer, is comprised of silicon, carbon and nitrogen in the form of an SiCN layer. A second dielectric layer 106 comprised of a low-k dielectric material, such as a silicon, carbon, oxygen and hydrogen containing layer with the chemical formula SiCOH, is formed above the etch stop layer 105, followed by a capping layer 107. The capping layer 107 may be comprised of two sub-layers 108 and 109, wherein the sub-layer 108 may be formed of silicon dioxide for strengthening a surface of the mechanically less stable low-k dielectric layer 106. The second sub-layer 109 may substantially serve as an ARC layer during the lithography process to be performed later for forming a trench in the capping layer 107, the low-k dielectric layer 106 and the etch stop layer 105. Hence, the composition and the thickness of the ARC layer 109 is selected in conformity with the exposure wavelength used in the subsequent lithography to minimize back reflection and standing wave effects. As previously noted, with the advance to a new technology node, for instance the transition from the 130 nm to the 90 nm technology, the dimensions of metal lines to be formed in the stack of layers 105, 106 and 107, also have to be significantly reduced, for instance by about 25%, wherein also an exposure wavelength of 193 nm may be applied instead of 248 nm. For this reason, the corresponding dimensions, i.e., the thicknesses of the layers 105, 106, 107 are adapted to the new design requirements and the newly used exposure wavelength starting from the well approved layer stack arrangement employed in the 130 nm technology using the 248 nm exposure wavelength. Typical dimensions obtained from transferring the 130 nm technology to a 90 nm technology may be approximately 50 nm for a thickness 105a of the etch stop layer 105, approximately 150 nm for a thickness 106a of the low-k dielectric layer 106, approximately 80 nm for a thickness 108a of the layer 108 when comprised of silicon dioxide and approximately 60 nm for a thickness 109a for the ARC layer 109 when comprised of silicon oxynitride.

A typical conventional process for forming the semiconductor device 100 as shown in FIG. 1a may comprise the following processes. First, the circuit element 102 is formed in and on the substrate 101 by known process techniques involving highly advanced photo-lithography using a 193 nm exposure wavelength, sophisticated etch, deposition, implantation and polishing sequences, which will not be referred to in detail herein. Thereafter, the first dielectric layer 103 may be formed by well-established plasma enhanced chemical vapor deposition (PECVD) techniques, possibly in combination with chemical mechanical polishing processes. Then, the contact element 104 is formed by highly advanced photolithography, etch and deposition techniques to first form a contact opening, which is then filled by a conductive material such as tungsten, tungsten silicide, and the like. Excess material of the contact element 104 may be removed by, for instance, chemical mechanical polishing as is well known in the art. Thereafter, the first etch stop layer 105 is deposited with the specified thickness 105a in conformity with well-established process recipes. Next, the low-k dielectric layer 106 is formed, in the present case, by depositing SiCOH from appropriate precursors by PECVD, with a thickness that is in conformity with device requirements. Thereafter, the silicon dioxide layer 108 may be deposited followed by the deposition of the ARC layer 109, which may both be deposited by well established PECVD techniques.

FIG. 1b schematically shows the semiconductor device 100 having formed thereon a resist mask 110 with an opening 111 substantially having the dimensions of a trench 112 that is to be formed in the capping layer 107, the low-k dielectric layer 106 and in the etch stop layer 105 in a subsequent etch process. The resist mask 110 is comprised of a resist material that is highly sensitive to an exposure wavelength of 193 nm and which also provides a moderate high etch selectivity during subsequent etch processes. Moreover, a thickness 110a of the resist mask 110 is selected to achieve an acceptable compromise between a high layer thickness for an enhanced masking effect in the subsequent etch process, as significant material removal is also generated in the resist mask 110 during the progress of the etch process, and the optical and development behavior of the resist during the lithography process. Hence, the thickness 110a may be selected to be approximately 320 nm. The resist mask 110 is formed in accordance with known lithography techniques using apparatus with 193 nm exposure wavelength, wherein the characteristics of the resist in combination with the ARC layer 109 and the silicon dioxide layer 108 enable the formation of the opening 111 having a lateral dimension significantly less than 193 nm. As it may readily be appreciated, any pre- and post-exposure treatments and pre- and post-development treatments may be performed in accordance with well-established recipes. Thereafter, the resist mask 110 is used to form the trench 112 during a highly anisotropic etch process.

FIG. 1c schematically shows the device 100 in an advanced stage of an anisotropic etch process, indicated as 120, wherein the trench 112 is already etched down to the etch stop layer 105. The conventional anisotropic etch process 120 includes three steps, wherein a first step is performed with a specified etch chemistry containing $CHF_3$ and oxygen to form the trench 112 in the capping layer 107. Thereafter, the etch chemistry is changed for a second or main etch step to achieve a desired removal rate and a substantially anisotropic material removal during forming the trench 112 through the low-k dielectric layer 106. The etch chemistry used during this second etch step may be based on $C_4F_8$, argon and nitrogen and a moderately high plasma power. As is evident from FIG. 1c, during the first and second etch steps, material of the resist mask 110 is also removed, wherein particularly edge regions 113 suffer from an increased material removal so that the edges of the capping layer 107 are preferably exposed to the etch attack. The main etch through the low-k dielectric layer 106 stops on and within the etch stop layer 105, wherein the material removal of the etch stop layer 105 may be monitored by a characteristic change of an endpoint detection signal that may be obtained by spectroscopic measurements of the gaseous by-products liberated during the etch process. At this time, the etch chemistry may be changed to efficiently open the etch stop layer 105, thereby completing the trench 112. Again, during this final etch step, which is typically performed with a reduced anisotropic behavior, the edge regions 113 are preferably attacked by the etchant. As previously noted, since the thickness 110a of the resist mask 110 may not be increased arbitrarily to substantially reduce the erosion of the edge regions 113, especially during the final etch step for opening the etch stop layer 105, owing to lithographical constraints, a high roughness at the trench edge is obtained, which may finally lead to increased leakage current and reduced line reliability, after coating the trench 112 with a barrier material and filling it with a metal, such as copper.

FIG. 1d schematically shows a top view of a plurality of trenches 112 having the edge regions 113, which exhibit a pronounced roughness, thereby causing the above-noted disadvantages.

In view of the line deterioration caused by the pronounced roughness of the edge regions of metal lines, there exists a need for an improved technique that enables the formation of trenches with reduced edge roughness even for manufacturing technology using an exposure wavelength of less than 248 nm.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the reduction of deleterious effects of an anisotropic etch process, even if a moderately thin resist mask is used. For this purpose, a low-k dielectric layer stack may be provided so that, in combination with an appropriately designed etch recipe, trenches with reduced dimensions may be formed, wherein the edge roughness of the trench is significantly reduced compared to the conventional approach.

According to one illustrative embodiment of the present invention, a method comprises forming a low-k dielectric layer on a contact layer, wherein the contact layer includes a dielectric material and a metal-containing contact element that connects to a circuit element. Moreover, an anti-reflective coating layer is formed above the low-k dielectric layer and a resist layer is formed on the anti-reflective coating layer. Furthermore, the resist layer is patterned and a trench is etched into the anti-reflective coating layer and the low-k dielectric layer, while the patterned resist layer is used as an etch mask.

According to another illustrative embodiment of the present invention, a semiconductor device comprises a first device layer having formed therein a circuit element, wherein the first device layer is located above a substrate. The semiconductor device further comprises a second device layer having formed therein a conductive contact extending through the second device layer and connecting to the circuit element. The semiconductor device further comprises a first metallization layer formed on the second device layer, wherein the first metallization layer comprises a metal line having a width, a length and a depth and extending in a depth direction to the second device layer to be in contact therewith. Moreover, the first metallization layer further comprises a dielectric capping layer having a first thickness and a low-k dielectric layer having a second thickness that is greater than the first thickness, wherein the capping layer is in contact with the low-k dielectric material layer, which continuously extends along the depth direction to the second device layer. Additionally, the semiconductor device comprises a second metallization layer formed above the first metallization layer.

BRIEF DESCRIPTION OF THE DRAWINGS

The invention may be understood by reference to the following description taken in conjunction with the accompanying drawings, in which like reference numerals identify like elements, and in which.

Figure 1A:
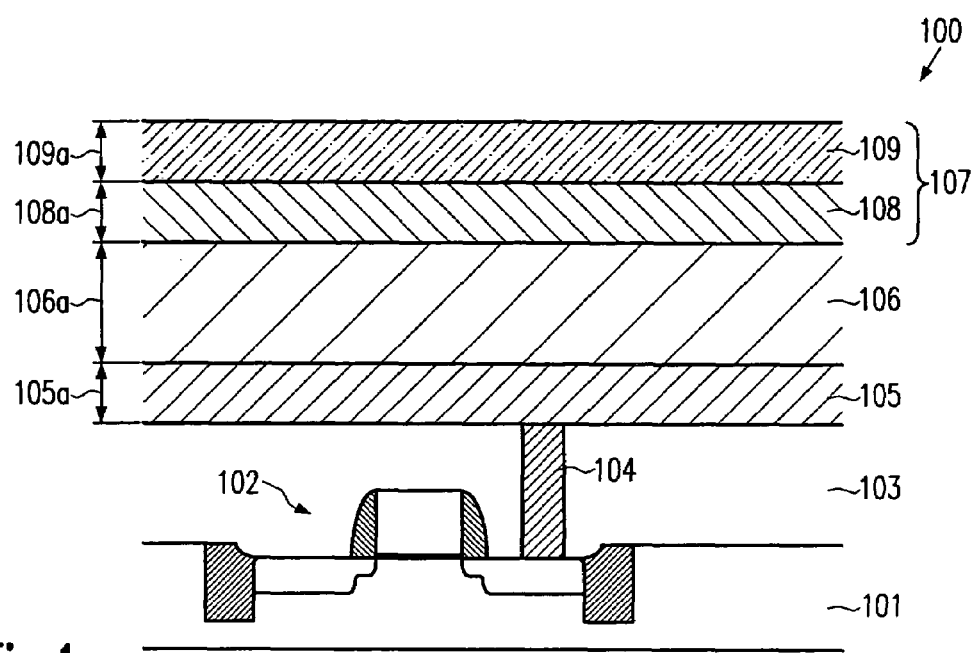
FIGS. 1a-1c schematically show cross-sectional views of a conventional semiconductor device during various manufacturing stages for forming a trench in a first metallization layer based on a 193 nm photolithography.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is based on the consideration that the layer stack including a low-k dielectric material for a first metallization layer may be redesigned (while corresponding to design requirements) to reduce the time period for which a highly sensitive resist mask is exposed to a reactive etch ambient to reduce at least some of the adverse effects of the etch process on the finally obtained metal line. In this way, even for moderately thin resist masks, as is required for a photolithography with an exposure wavelength of 193 nm, reliable metal lines of reduced dimensions may be formed. It should be appreciated, however, that the present invention is highly advantageous in combination with semiconductor devices requiring a 193 nm lithography, since conventional approaches as described above with reference to FIGS. 1a-1d may not arrive at acceptable results. However, the present invention may also be applied to less critical applications, such as semiconductor devices formed on the basis of a 248 nm lithography, wherein some of the illustrative embodiments to be described may provide reduced production costs and/or enhanced production yield.

Figure 2A:
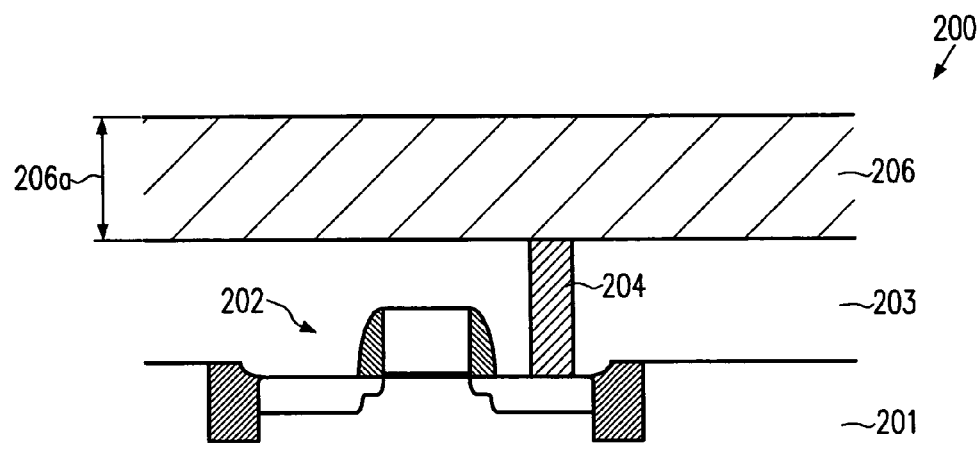
FIGS. 2a-2d schematically show cross-sectional views of a semiconductor device during various stages in forming a trench of a first metallization layer with reduced trench edge roughness in accordance with illustrative embodiments of the present invention.

With reference to FIGS. 2a-2f, further illustrative embodiments of the present invention will now be described in more detail. FIG. 2a schematically shows a cross-sectional view of a semiconductor device 200 comprising a substrate 201 with a circuit element 202 formed therein and/or thereon. A dielectric layer 203 is formed above the substrate 201 to enclose the circuit element 202. The dielectric layer 203 may be formed of any appropriate dielectric material, such as silicon dioxide, silicon nitride, silicon carbide, silicon carbide nitride, and the like. An electrically conductive contact element 204 is formed in the dielectric layer 203 in such a way that the contact element 204 extends through the dielectric layer 203 to connect to the circuit element 202 or a portion thereof. Since the dielectric layer 203 accommodates the contact element 204, the dielectric layer 203 may also be referred to as contact layer and the dielectric material contained therein may be referred to as contact interlayer dielectric. Since a portion of the substrate 201 or material layers formed thereon accommodating at least partially the circuit element 202 and the dielectric layer 203 including the contact element 204 are directly related to individual circuit devices, the corresponding levels or layers may also be referred to hereinafter as device layers contrary to any "wiring" layer or metallization layers that are to be formed above the layer 203.

A low-k dielectric layer 206 is formed on the dielectric layer 203, and is, in one particular embodiment, comprised of silicon, carbon, oxygen and hydrogen (SiCOH) with a substantially homogeneous material composition along a depth or thickness 206a. That is, the material composition of the low-k dielectric layer 206 is substantially the same throughout the entire thickness 206a down to the dielectric layer 203. Providing the low-k dielectric layer 206 in the form of a SiCOH layer offers a high degree of compatibility with the conventional process flow described with reference to FIGS. 1a-1c, thereby substantially avoiding laborious and expensive modifications of process recipes and tools used for forming the low-k dielectric layer 206. Moreover, SiCOH is a well-approved low-k dielectric material that may be formed by relatively inexpensive CVD techniques. However, in other embodiments, it may be deemed appropriate to use other low-k dielectric materials, which may require sophisticated spin-on techniques and the like. The thickness 206a of the layer 206 is selected in accordance with design requirements. That is, for a given metallization metal such as copper or a copper alloy in combination with a barrier material and for given minimum lateral dimensions of the circuit elements 202 and the expected power consumption thereof, the width of metal lines to be formed in the low-k dielectric layer 206 is substantially determined by a minimum spacing to a neighboring metal line and thus determines, in combination with the thickness 106a, the available cross-sectional area of the corresponding metal line. Thus, the thickness 206a, that is the depth or thickness of metal lines due to be formed, is selected to achieve a conductivity required to appropriately adjust a current density encountered during the operation of the semiconductor device 200. For instance, for a 90 nm technology microprocessor having substantially the same electric behavior as the semiconductor device 100 described with reference to FIGS. 1a-1d, the thickness 206a may be selected to be approximately 200 nm, which corresponds to the combined thickness of the layers 106 and 105 of the semiconductor device 100. However, other values may be used in accordance with design requirements, especially the thickness 206a may be less than 200 nm for further scaled device generations.

Figure 1B:
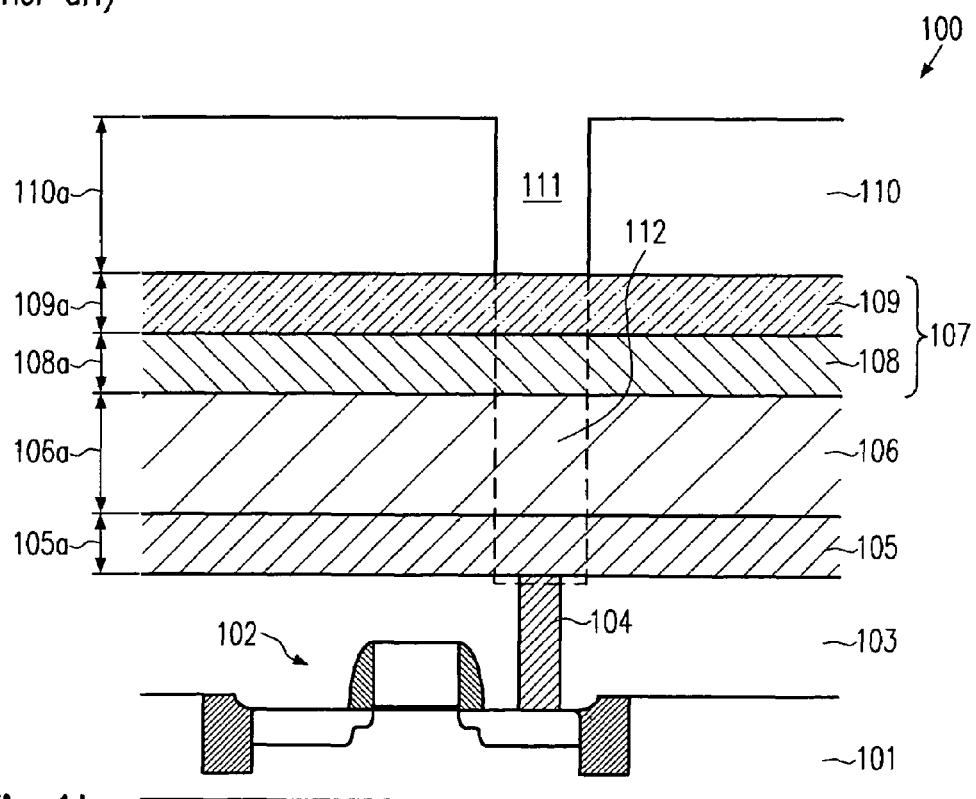
Figure 1C:
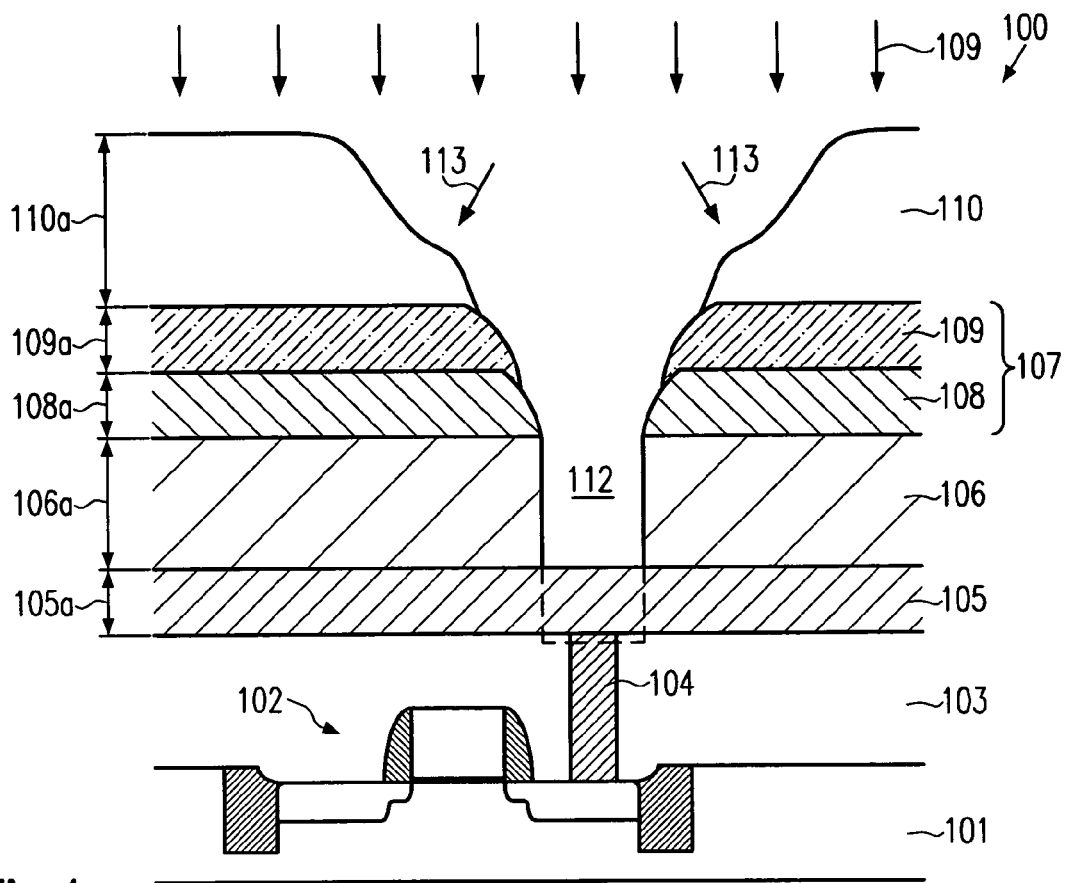
Figure 1D:
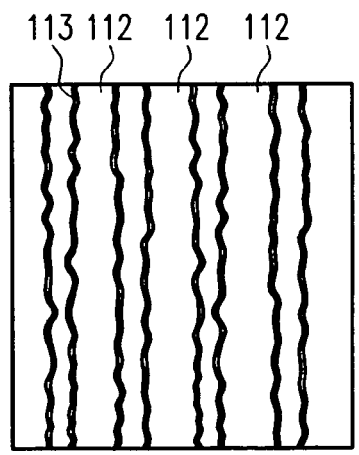
FIG. 1d schematically shows a top view illustrating a plurality of trenches formed corresponding to the process flow described with reference to FIGS. 1a-1c, wherein the respective trenches exhibit a significant edge roughness.

A typical process flow for forming the semiconductor device 200 as shown in FIG. 2a may comprise the following processes. Regarding the formation of the circuit element 202 in and on the substrate 201, the same criteria apply as previously explained with reference to FIG. 1a. Thereafter, the dielectric layer 203 may be formed by any appropriate formation process, such as PECVD, possibly followed by a planarization process, such as chemical mechanical polishing, to obtain a planarized surface of the layer 203, which may then be effectively patterned to form the contact element 204. The formation of the contact element 204 may be accomplished in the same way as is described with reference to FIG. 1a. Thereafter, the low-k dielectric layer 206 may be formed, for instance, by PECVD or spin-on techniques, wherein process parameters are controlled to obtain the specified thickness 206a. In some embodiments, the difference in materials of the layer 206 and the layer 203 are considered sufficient to provide enough selectivity and/or indication to stop or indicate a final phase of an anisotropic etch process that is to be performed in patterning the low-k dielectric layer 206 for obtaining a trench therein. For example, if the dielectric layer 203 comprises silicon dioxide or silicon nitride, the etch selectivity is typically sufficient to reliably stop a corresponding etch process. Thus, a further etch stop layer formed between the dielectric layer 203 and the low-k dielectric layer 206 may effectively be omitted, thereby reducing process complexity in forming a first metallization layer above the dielectric layer 203. In other embodiments, a specifically designed etch stop layer may be incorporated into the dielectric layer 203, for instance by replacing an upper portion thereof, and may be provided, for instance in the form of a BLOK layer similarly as is shown in FIGS. 1a-1c, wherein, contrary to the conventional device, the BLOK layer is a part of the dielectric layer 203 and is patterned during the formation of the contact element 204. A corresponding embodiment is shown in FIG. 2c and will be described later on in more detail.

Figure 2B:
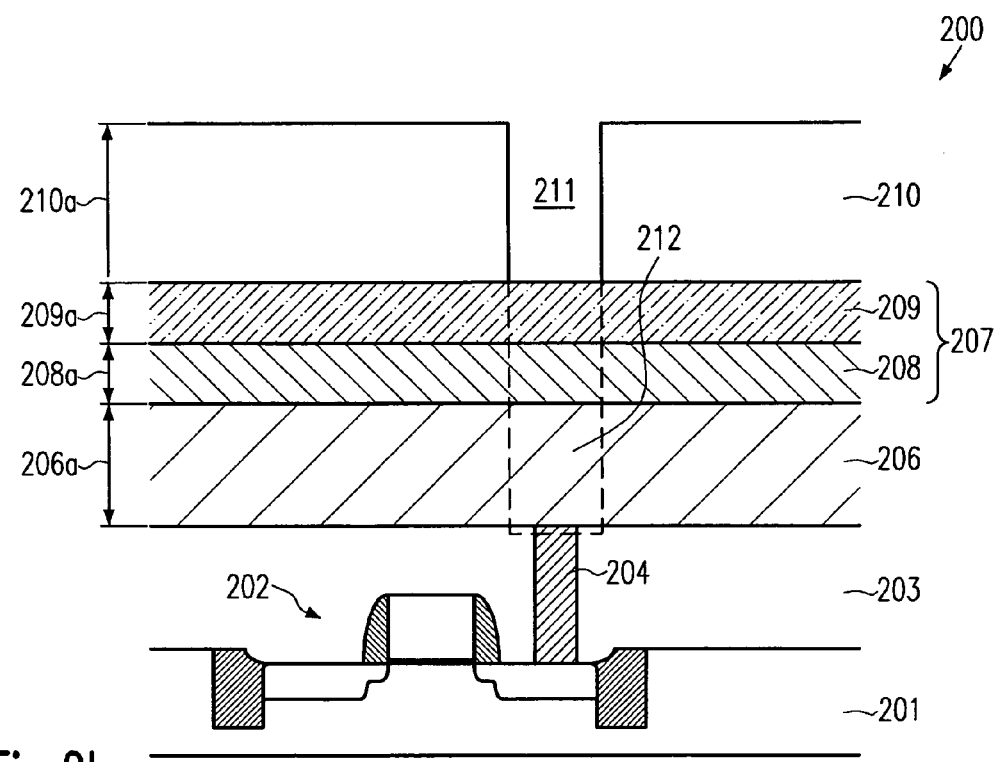

FIG. 2b schematically shows the semiconductor device 200 with a capping layer 207 formed on the low-k dielectric layer 206 and with a resist mask 210 formed above the capping layer 207. The resist mask 210 includes an opening 211 that substantially represents the dimensions and shape of a trench 212 to be formed in the capping layer 207 and the low-k dielectric layer 206. The capping layer 207 is formed with respect to material composition and thickness to serve as a mechanical stabilization layer for the layer 206 and to serve as an anti-reflective coating layer for a lithography in patterning the resist mask 210. Thus, a thickness of the capping layer 207, which is typically significantly less compared to the thickness 206a in view of the usually higher permittivity of the capping layer 207, is selected on the basis of the materials used and the exposure wavelength of the involved lithography. In one particular embodiment relating to a 193 nm lithography, the capping layer 207 may be comprised of a first sub-layer 208, which substantially serves as a stabilization layer and may be comprised of silicon dioxide, and a second sub-layer 209, which substantially serves as an anti-reflective coating layer and is comprised of, for instance, silicon oxynitride. Corresponding thicknesses 208a, 209a may be selected to be approximately 70-90 nm and 40-60 nm, respectively. Hence, in sophisticated semiconductor devices, the thickness of the capping layer 207 may be approximately 150 nm and may be significantly less for future device generations. Similarly, a thickness 210a of the resist mask 210 for a 90 nm technology device may be approximately 330 nm or less and may be significantly less for future device generations.

The capping layer 207 and the resist mask 210 may be formed according to the same process strategy as is also described with reference to FIG. 1a with respect to the capping layer 107 and the resist mask 110.

Figure 2C:
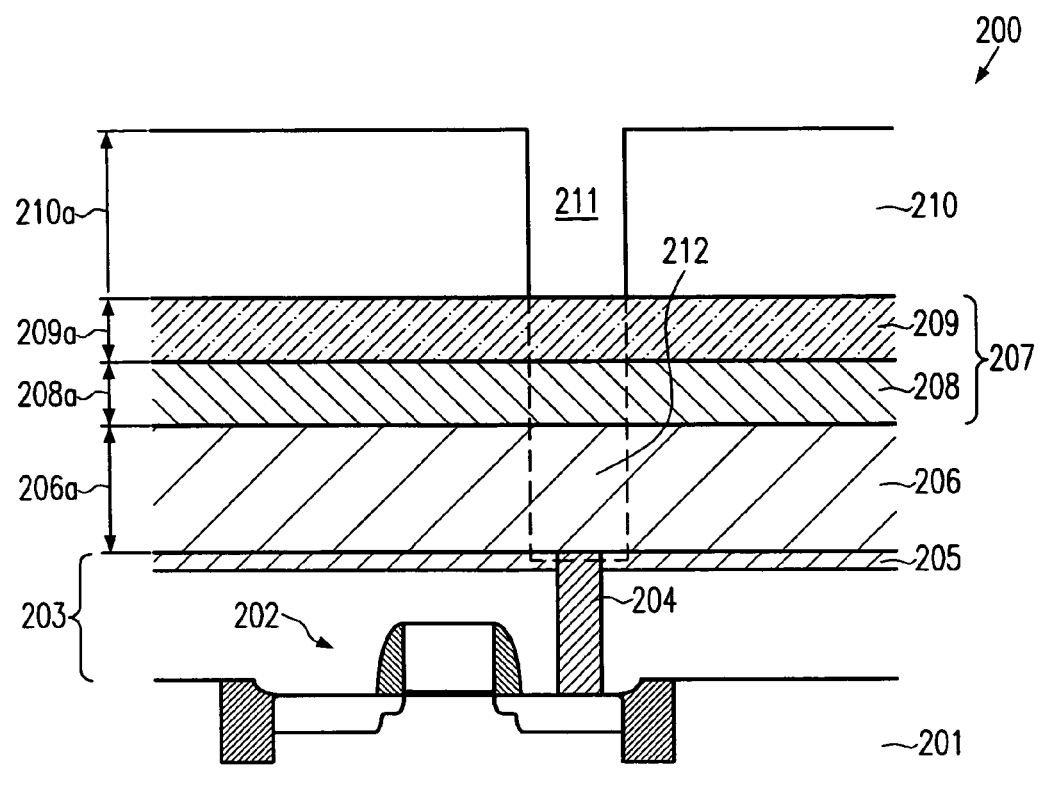

FIG. 2c schematically shows the semiconductor device 200 according to a further illustrative embodiment, wherein the dielectric layer 203 may comprise an additional etch stop layer 205, which may be formed of any appropriate material, such as a low-k material in the form of silicon carbide or silicon carbide nitride. The additional etch stop layer 205 within the dielectric layer 203 may be formed when superior characteristics in view of etch stopping qualities and/or endpoint indicating qualities and/or diffusion blocking qualities are desirable. For instance, in copper-based metallization layers, typically a conductive barrier layer may be provided on exposed surfaces of trenches and vias to reduce diffusion of copper atoms into the dielectric and reduce the diffusion of dielectric material into the copper, as copper readily diffuses in a plurality of materials, such as silicon dioxide. A corresponding barrier layer may, however, not be desirable at the bottom of the trench 212 so as to not unduly increase the transition resistance to the underlying contact element 204. In this case, the additional etch stop layer 205 may effectively prevent a copper diffusion into the neighboring dielectric material, when a barrier layer of reduced thickness is provided at the bottom of the trench 202. Similarly, if superior etch indicator or etch stopping qualities are required, a specifically designed etch stop layer 205 may be provided within the dielectric layer 203. During the formation of the dielectric layer 203, the thickness thereof may be selected smaller to take into account the additional etch stop layer 205, which is then formed such that the total thickness of the layer 203 corresponds to design requirements. During the formation of the contact element 204, a slight modification of the corresponding anisotropic etch process may be required to firstly open the additional etch stop layer 205 and subsequently patterning the remainder of the layer 203 similarly as in the process described with reference to FIGS. 2a and 1a. Thereafter, the further process flow may continue as is described with reference to FIG. 2b.

Figure 2D:
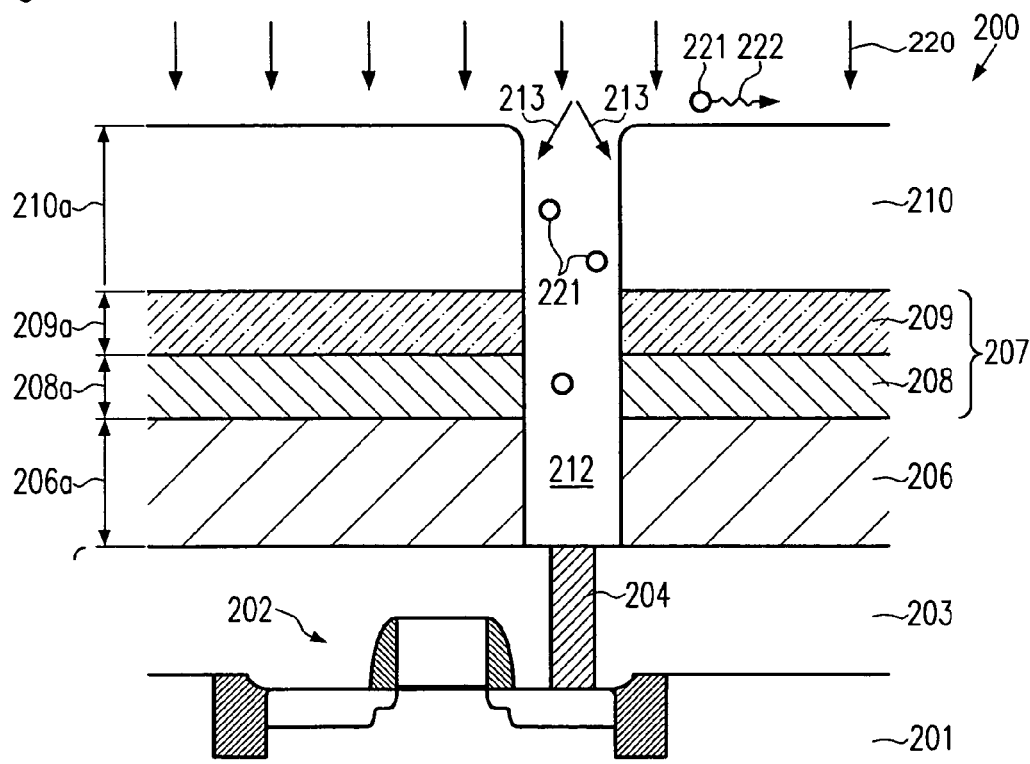

FIG. 2d schematically shows the semiconductor device 200 at a final phase of an anisotropic etch process 220 for forming the trench 212 through the capping layer 207 and the low-k dielectric layer 206. Contrary to the conventional approach, the anisotropic etch process 220 is performed as a two-step process, wherein a first step etches through the capping layer 207 and wherein a second or main step etch etches through the low-k dielectric layer 206. When the etch front of the process 220 reaches the dielectric layer 203, irrespective of whether it comprises the additional etch stop layer 205 or not, the etch process 220 may reliably be stopped at the layer 203, wherein etch parameters may be selected to reduce the total etch time of the main etch step compared to the conventional process for the second and third steps, i.e., for etching through the dielectric layer 106 and the etch stop layer 105. Thus, edge regions 213 are less prone to a reactive attack of the etch process 220 and thus, the formation of an edge roughness is significantly reduced. Upon arriving at the layer 203, any gaseous etch by-products 221 liberated during the interaction of the etch front with the layer 203 may be monitored by the light signal 222 emitted from the by-products 221. Hence, an endpoint of the main etch step through the layer 206 may reliably be detected and the etch process may be stopped, possibly by applying a specified over-etch time, on the basis of the light signal 222.

The etch process 220 may be performed on any appropriate anisotropic etch tool having associated therewith a corresponding endpoint detection system. Corresponding etch tools are well known in the art and are readily available on the market. In one particular embodiment, a trench etch tool available under the trade name UNITY 2E from TEL (Tokyo Electron LTD) may be used. In one particular embodiment, the first etch step for breaking through the capping layer 207 may be performed at a reduced oxygen level with an etchant on the basis of $CHF_3$ to obtain a moderately high etch rate, while the main etch step is based on a $C_4F_8$, argon, nitrogen chemistry, and may be performed at a moderate plasma power to slow down the etch rate, thereby reducing the interaction of the reactive ambient with the edge regions 213 and also providing the possibility for a reliable detection of the endpoint of the etch process 220. Due to the increased etch rate during the first etch step and due to the absence of a further etch stop layer between the dielectric layer 203 and the low-k dielectric layer 206, the overall etch time may be significantly less compared to the conventional three step approach. In one embodiment, using the above-identified TEL UNITY 2E etcher, the first step for breaking through the capping layer 207 may be performed for approximately 40 seconds or less with a thickness of the capping layer as specified above. The main etch step for the low-k dielectric layer 206 with a thickness of approximately 200 nm or less may be performed for approximately 55 seconds or less. In one illustrative embodiment, the break-through step may be performed with the above specified etch tool, on the basis of $CHF_3$ and oxygen at approximately 50 mTorr with flow rates of approximately 30 and 8 sccm, respectively, wherein plasma power of approximately 500 watts is applied. The main etch step may be performed on the basis of $C_4F_8$, argon, nitrogen at flow rates of approximately 5, 740, 110 sccm, respectively, wherein a pressure is maintained at approximately 70 mTorr with a plasma power of approximately 1200 watts. It should be appreciated, however, that the above process parameters are illustrative only and may readily be adapted to other processes and etch tools, wherein, based on the technical teaching provided herein, appropriate process parameters may be established on the basis of test runs using semiconductor devices 200 as shown in FIGS. 2a-2d or appropriately prepared test substrates having formed thereon at least a layer stack comprised of the layers 203, 206 and 207.

In embodiments using the additional etch stop layer 205 within the layer 203, well established conventional etch parameters as used in the second step described with reference to FIG. 1c may be used, that is, an increased etch rate during the main etch step, since here the etch process may reliably be stopped at or in the additional etch stop layer 205.

Hence, the total process time for patterning the trench 212 may further be reduced, thereby increasing throughput and thus reducing production costs.

Figure 2E:
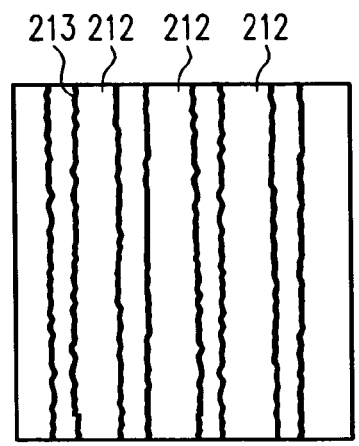
FIG. 2e illustrates a top view of a plurality of densely spaced trenches for a first metallization layer with improved trench edge roughness.

FIG. 2e schematically shows a top view of the semiconductor device 200 with a plurality of adjacent trenches 212, wherein the dimensions of the trenches 212 formed in accordance with a device design for a 90 nm technology device are identical to the one described with reference to FIGS. 1a-1d. As is evident from FIG. 2e, the edge roughness at the edge regions 213 is significantly less pronounced compared to the edge regions 113 in FIG. 1d. Thus, disadvantageous effects caused by a trench etch process, such as leakage current between two neighboring metal lines formed in the trenches 212, are significantly reduced.

Figure 2F:
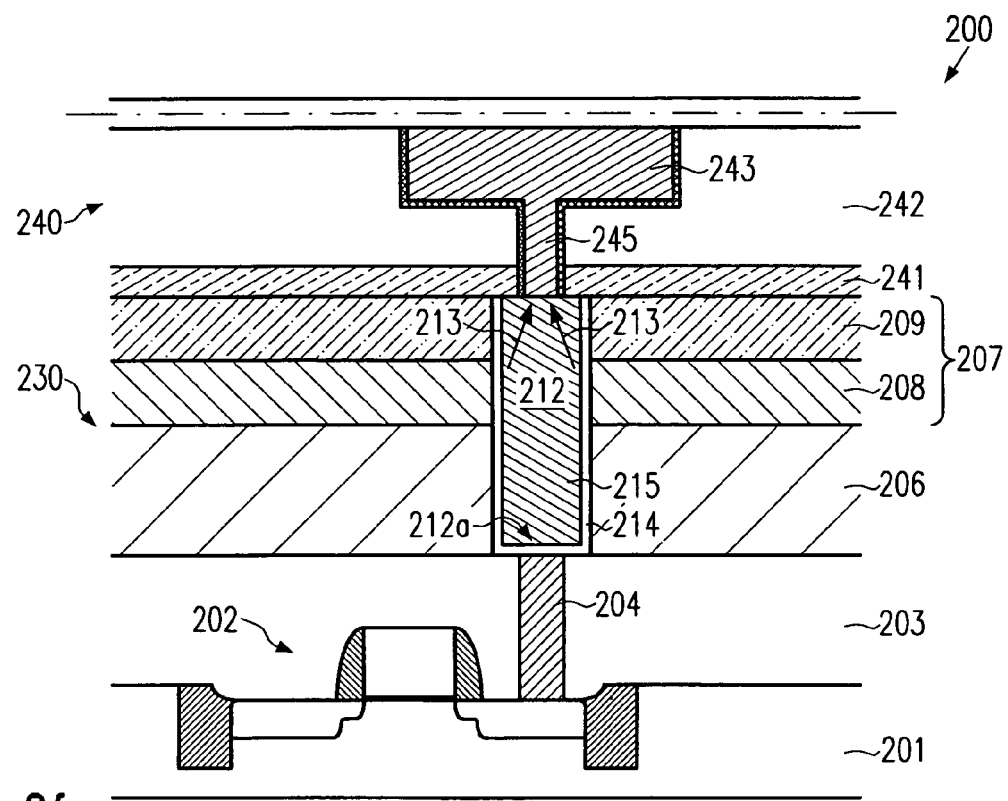
FIG. 2f schematically depicts a cross-sectional view of a semiconductor device including a first metallization layer and at least one further metallization layer in accordance with an illustrative embodiment of the present invention, wherein leakage current and line reliability is improved compared to the conventional approach.

FIG. 2f schematically shows a semiconductor device 200 in a further advanced manufacturing stage. The semiconductor device 200 comprises a metal 215 filled into the trench 212, wherein a barrier layer 214 may be formed that separates the metal 215 from the dielectric material of the layer 206. In modern integrated circuits, the metal 215 may comprise copper and the barrier material may be comprised of tantalum, tantalum nitride, titanium, titanium nitride, and the like. As previously explained with reference to FIG. 2c, a thickness of the barrier layer 204 at a bottom 212a of the trench 212 may be reduced, when the dielectric layer 213 comprises an additional etch stop layer having copper diffusion blocking capabilities. The capping layer 207 and the low-k dielectric layer 206, in combination with the metal filled trench 212, represents a first metallization layer 230. Formed above the first metallization layer 230 is a second metallization layer 240, which may comprise an etch stop layer 241, a low-k dielectric layer 242 having formed therein a metal line 243 and a via 245 connecting to one of the metal filled trenches 212.

A typical process flow for forming the semiconductor device 200 as shown in FIG. 2f may comprise the following processes. First, the barrier layer 214 may be formed within the trench 212 by, for example, advanced sputter deposition techniques, atomic layer deposition, and the like, followed by the formation of a seed layer, which may be formed by sputter deposition, electroless wet chemical deposition, and the like. Due to reduced roughness at the edge regions 213, the coverage of trench surfaces at the regions 213 during the formation of the barrier layer 214 and the seed layer (not shown) is significantly improved, thereby contributing to the superior reliability of the metal line 215. Subsequently, the bulk metal, such as the copper, is filled in by, for instance, electroplating and subsequently excess metal is removed by, for instance, chemical mechanical polishing, wherein the capping layer 207 may serve as a stop layer for the polishing process. Thereafter, the etch stop layer 241 may be deposited followed by the dielectric layer 242 and the metal line 243 and the via 245 may be formed in accordance with well established dual damascene processes or any other appropriate manufacturing scheme.

As a result, the present invention provides a simplified dielectric layer stack including a low-k dielectric material that is used for the formation of a first metallization layer. Due to the simplified construction of the layer stack, in which a conventionally used low-k etch stop layer is omitted, the trench degradation may significantly be reduced even for a patterning process on the basis of a 193 nm lithography. Moreover, in combination with an improved etch process, the effectiveness of the simplified layer stack may further be enhanced. In some embodiments, the simplified layer stack may reduce process complexity, save raw materials and increase throughput, since one etch step can be omitted. Compared to conventional approaches, the resulting semiconductor devices show an enhanced performance in terms of leakage current and device reliability.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   forming a low-k dielectric layer on a contact layer, said contact layer including a dielectric material and exposed metal-containing contact connecting to a circuit element;
   forming an anti-reflective coating layer above said low-k dielectric layer;
   forming a resist layer on said anti-reflective coating layer;
   patterning said resist layer;
   etching a trench in said anti-reflective coating layer and said low-k dielectric layer while using said patterned resist layer as an etch mask, said etching including a first etch step to etch through said anti-reflective coating layer and a second etch step to etch through said low-k dielectric layer, said second etch step being stopped in said contact layer.

2. The method of claim 1, wherein said resist layer is patterned using a photolithography process at an exposure wavelength of approximately 193 nm.

3. The method of claim 1, wherein said contact layer is used for endpoint detection during said second step.

4. The method of claim 1, wherein said low-k dielectric layer is comprised of silicon, carbon, oxygen and hydrogen (SiCOH).

5. The method of claim 1, wherein forming said anti-reflective coating layer comprises forming a first sub-layer and forming a second sub-layer.

6. The method of claim 1, wherein a width of said trench is approximately 100 nm or less.

7. The method of claim 1, wherein etching said trench is performed in a reactive plasma ambient for a time period of approximately 100 seconds or less.

8. The method of claim 7, wherein etching said trench is performed for a time period of approximately 90 seconds or less.

9. The method of claim 1, wherein said first step is performed in a reactive plasma atmosphere on the basis of $CHF_3$ and oxygen.

10. The method of claim 9, wherein said first step is performed for a time period of approximately 40 seconds or less.

11. The method of claim 1, wherein said second step is performed in a reactive plasma atmosphere on the basis of $C_4F_8$, argon and nitrogen.

12. The method of claim 11, wherein said second step is performed for a time period of approximately 60 seconds or less.

13. The method of claim 1, further comprising filling in a metal into said trench.

14. The method of claim 13, further comprising forming a conductive barrier layer on exposed surfaces of said trench prior to filling in said metal.

15. The method of claim 13, wherein said metal comprises copper.

16. The method of claim 1, wherein the contact layer comprises an etch stop layer formed above the dielectric material, wherein the metal-containing contact is exposed through the etch stop layer prior to the formation of the low-k dielectric layer.

* * * * *